(12) United States Patent
Osipov et al.

(10) Patent No.: US 7,164,181 B2
(45) Date of Patent: *Jan. 16, 2007

(54) SPIN INJECTION DEVICES

(75) Inventors: Viatcheslav V. Osipov, Mountain View, CA (US); Alexandr M. Bratkovski, Mountain View, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 158 days.

This patent is subject to a terminal disclaimer.

(21) Appl. No.: 10/631,999

(22) Filed: Jul. 30, 2003

(65) Prior Publication Data

US 2005/0026307 A1 Feb. 3, 2005

(51) Int. Cl.
*H01L 43/00* (2006.01)

(52) U.S. Cl. ............................. 257/422; 257/425; 438/3

(58) Field of Classification Search ................ 257/422, 257/425; 438/3
See application file for complete search history.

(56) References Cited

U.S. PATENT DOCUMENTS

| | | | |
|---|---|---|---|
| 5,565,695 A | | 10/1996 | Johnson |
| 5,629,549 A | * | 5/1997 | Johnson ...................... 257/421 |
| 5,966,012 A | * | 10/1999 | Parkin ......................... 324/252 |
| 6,624,490 B1 | * | 9/2003 | Flatte et al. ................ 257/421 |
| 6,774,446 B1 | * | 8/2004 | Osipov et al. ............... 257/421 |
| 6,809,388 B1 | * | 10/2004 | Ossipov et al. ............. 257/421 |
| 6,878,979 B1 | * | 4/2005 | Matsukawa et al. ........ 257/295 |
| 6,879,013 B1 | * | 4/2005 | Osipov et al. ............... 257/421 |
| 6,888,208 B1 | * | 5/2005 | Osipov et al. ............... 257/421 |
| 2005/0023519 A1 | * | 2/2005 | Osipov et al. ................. 257/17 |

FOREIGN PATENT DOCUMENTS

| | | |
|---|---|---|
| DE | 19746138 | 4/1999 |
| DE | 10019697 | 11/2001 |

OTHER PUBLICATIONS

Sarma, Sankar Das, "Spintronics" American Scientist, vol. 89, pp. 516-523 (Nov.-Dec. 2001).
Wolf, S.A. et al., "Spintronics: A Spin-Based Electronics Vision for the Future" Science, vol. 294, pp. 1488-1495 (Nov. 16, 2001).
V V Osipov et al—"A Class of Spin Injection-Precession Ultrafast Nanodevices"—Applied Physics Letter—vol. 84 No. 12—Mar. 22, 2004—pp. 2118-2120.
Supriyo Datta et al—"Electric Analog of the Electro-Optic Modulator"—Applied Physics Letters—vol. 56 No. 7—Feb. 12, 1990—pp. 665-667.

* cited by examiner

*Primary Examiner*—Fernando L. Toledo

(57) ABSTRACT

Devices such as transistors, amplifiers, frequency multipliers, and square-law detectors use injection of spin-polarized electrons from one magnetic region, into another through a control region and spin precession of injected electrons in a magnetic field induced by current in a nanowire. In one configuration, the nanowire is also one of the magnetic regions and the control region is a semiconductor region between the magnetic nanowire and the other magnetic region. Alternatively, the nanowire is insulated from the control region and the two separate magnetic regions. The relative magnetizations of the magnetic regions can be selected to achieve desired device properties. A first voltage applied between one magnetic region and the other magnetic nanowire or region causes injection of spin-polarized electrons through the control region, and a second voltage applied between the ends of the nanowire causes a current and a magnetic field that rotates electron spins to control device conductivity.

23 Claims, 5 Drawing Sheets

SPIN INJECTION DEVICES

This patent document is related and hereby incorporates by reference in their entirety U.S. patent application Ser. No. 10/284,183, filed Oct. 31, 2002, entitled: "Efficient Spin-Injection Into Semiconductors" (now U.S. Pat. No. 6,774,446); U.S. patent application Ser. No. 10/284,360, filed Oct. 31, 2002, entitled: "Magnetic Sensor Based on Efficient Spin Injection into Semiconductor" (now U.S. Pat. No. 6,809,388); co-filed U.S. patent application Ser. No. 10/632,038, entitled "Amplifiers Using Spin Injection and Magnetic Control of Electron Spins," (now U.S. Pat. No. 6,879,013); and co-filed U.S. patent application Ser. No. 10/631,951, entitled "Square-Law Detector Based on Spin Injection and Nanowires" (now U.S. Pat. No. 6,888,208).

BACKGROUND

Traditional semiconductor devices based on control of the flow and the density of electric charge (e.g., electrons or holes) are nearing a point where every step towards miniaturization or towards increasing the operating speed demands new technology and huge investments. In particular, as semiconductor devices become smaller (e.g., near nanometer scale) or need to operate at faster speeds, the heat that electrical currents generate in semiconductor devices becomes a greater problem. Additionally, semiconductor devices are now reaching sizes at which previously ignored quantum-mechanical properties such as spin are significant. Dealing with these quantum-mechanical properties can be a challenge in the design of traditional semiconductor devices, but such quantum mechanical properties also provide the potential for alternative mechanisms for device operation.

One important quantum property of electrons is their spin. The spin of an electron gives the electron an intrinsic magnetic moment that can interact with electromagnetic fields. The spin interactions of electrons therefore provide a potential mechanism for operational devices, and such devices can potentially provide much greater operating speeds and generate less heat than do traditional devices. The field of spintronics has thus arisen from efforts to develop fast solid-state devices such as magnetic sensors and transistors of nanometer proportions that use the spins or the associated magnetic moments of electrons.

S. Datta and B. Das in "Electronic Analog of the Electrooptic Modulator," Applied Physics Letters, Vol. 56, p 665 proposed a spin transistor based on the spin-orbital coupling of electrons to a gated electric field. Other types of spintronic devices are now sought to provide fast operation, low heat generation, and scalability down to nanometer sizes.

SUMMARY

In accordance with an aspect of the invention, ultrafast solid-state devices such as transistors, power current amplifiers, frequency multipliers, and square-law detectors are based on injection of spin-polarized electrons from a magnetic emitter to a magnetic collector. A magnetic field, which a base current through a wire generates in a control region between the magnetic emitter and the magnetic collector, controls rotation of the spins of injected electrons and thereby controls the conductivity of the device and the magnitude of the injection current. The control region can be made of a conventional or organic semiconductor material, and the devices can be fabricated using integrated circuit processing techniques to generate a variety of device geometries.

BRIEF DESCRIPTION OF THE DRAWINGS

Use of the same reference symbols in different figures indicates similar or identical items.

DETAILED DESCRIPTION

In accordance with an aspect of the invention, spin injection devices inject spin-polarized electrons from a first magnetic region through an intervening control region into a second magnetic region. The devices use current through a nanowire to generate a magnetic field in the control region, and the magnetic field in the control region rotates the spin of electrons crossing the control region. The current in the nanowire thereby controls the current through the control region by controlling whether the electrons that cross the control region have spins in the appropriate direction for conduction electrons entering the second magnetic region. Different relative orientations of the magnetizations of the first and second magnetic regions can be used to give the device properties suitable for high-speed operation as a current amplifier, a square-law detector, a frequency multiplier, or a pulse transistor.

Figure 1A:
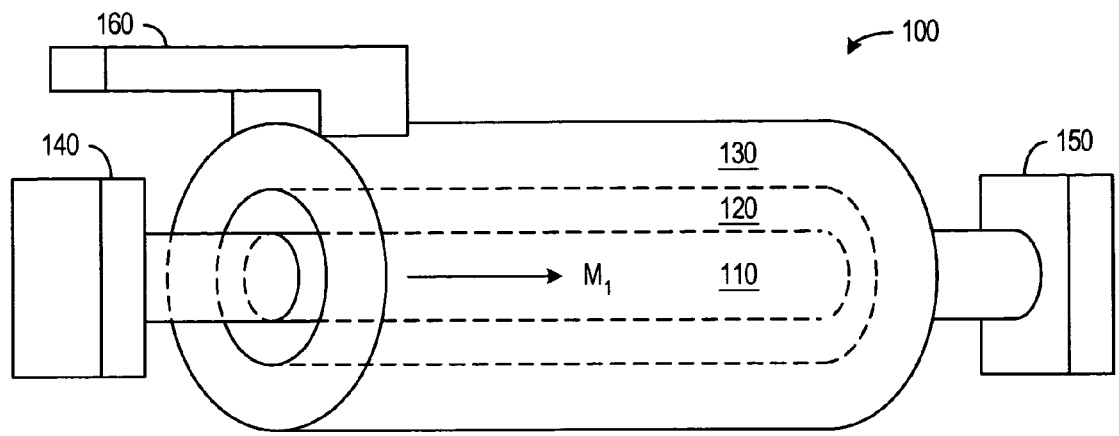
FIG. 1A shows a perspective view of a spin injection device according to an embodiment of the invention including concentric magnetic and semiconductor nanowires.

FIG. 1A shows a perspective view of a spin injection device 100 in accordance with a radially-symmetric embodiment of the present invention. As illustrated, device 100 includes a nanowire 110 made of a magnetic material, a thin semiconductor layer 120 surrounding nanowire 110, and a magnetic layer 130 surrounding semiconductor layer 120.

Magnetic nanowire 110 and magnetic layer 130 may each be formed from various magnetic materials including ferromagnetic metals Ni, Fe, and Co and various magnetic alloys, which may include one or a combination of Fe, Co, Ni, $CrO_2$, and $Fe_3O_4$ and different magnetic semiconductors such as GaAs:Mn, $CaB_6$, and $Ca_{1-x}La_xB_6$.

Semiconductor layer 120 may be formed from various semiconductor materials including Si, Ge, GaAs, ZnTe, GaSb, GaP, InAs, CdSe, InP, InSb, CdTe, CdS, ZnS, ZnSe, AlP, AlAs, AlSb and also alloys and combinations of these materials. For reasons discussed below, semiconductor layer 120 is preferably formed from a material such as GaAs, GaInAs, Ge, Si, ZnSe and ZnCdSe that provides a relatively large time $\tau_S$ of electron spin relaxation and preferably has a negative doping.

Figure 1B:
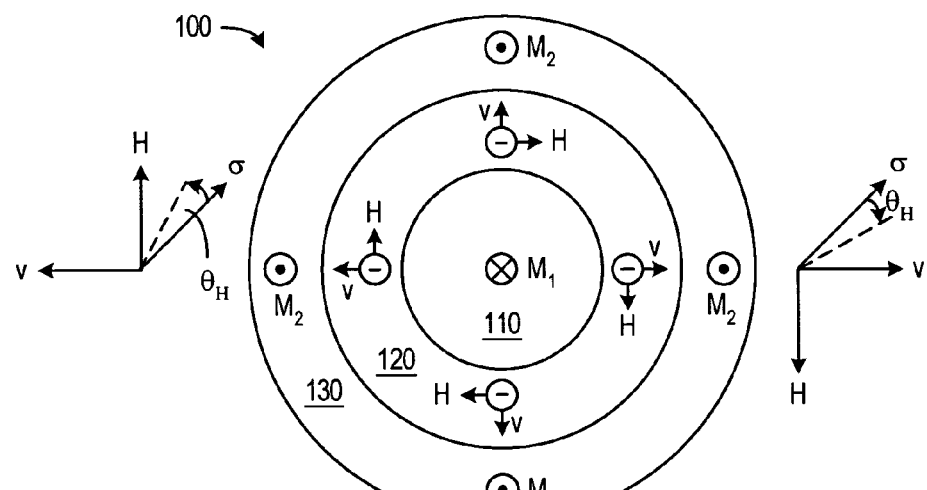
FIGS. 1B and 1C are cross-sectional views illustrating alternative magnetization directions in the spin injection device of FIG. 1A.
Figure 1C:
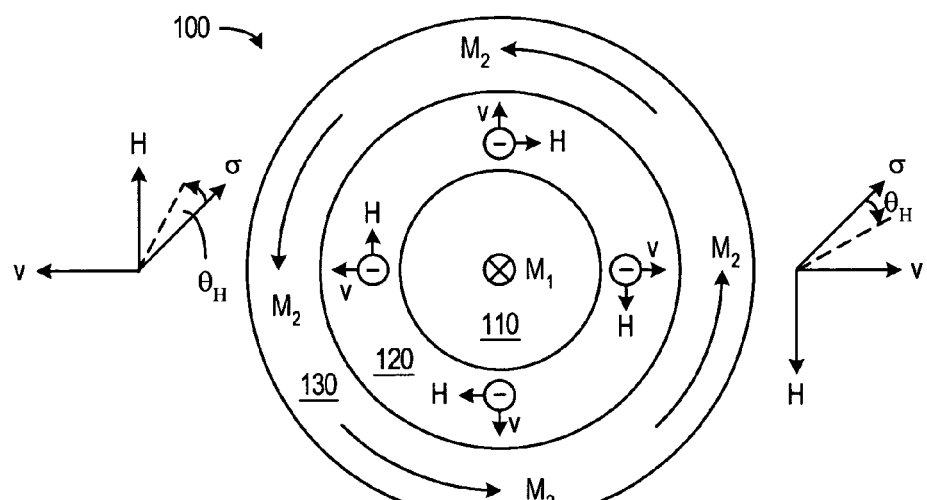

Operation of device 100 is based on injection of spin-polarized electrons from magnetic nanowire 110 into magnetic layer 130 through semiconductor layer 120. Generally, for alternative embodiments of the invention described further below, an angle $\theta_0$ between a magnetization $M_1$ of nanowire 110 and a magnetization $M_2$ of magnetic layer 130 can be selected as required to provide device 100 with desired properties. FIG. 1B illustrates an exemplary embodiment in which magnetic nanowire 110 has a magnetization $M_1$ directed along the axis of nanowire 110, and magnetic layer 130 has a magnetization $M_2$ that is opposite (or antiparallel) to magnetization $M_1$. FIG. 1C illustrates one alternative embodiment where magnetic nanowire 110 has a magnetization $M_1$ directed along the axis of nanowire 110, and magnetic layer 130 has a magnetization $M_2$ that is perpendicular to magnetization $M_1$. As a result, the angle $\theta_0$ between magnetizations $M_1$ and $M_2$ is 180° or $\pi$ for the configuration of FIG. 1B and is 90° or $\pi/2$ for the configuration of FIG. 1C. A flow of electrons from magnetic nanowire 110 to magnetic layer 130 generally depends on the angle $\theta_0$ between the magnetizations in magnetic layers 110 and 130, and on the rotation of electron spins in semiconductor layer 120.

FIG. 1A shows electrical contacts 140 and 150 at opposite ends of nanowire 110. In operation, a base voltage $V_b$ applied between electrical contacts 140 and 150 causes a base current $J_b$ to flow through magnetic nanowire 110. As a definite example, the following discussion assumes that contact 140 is grounded and that base voltage $V_b$ applied to terminal 150 has a negative polarity, causing a current flow from contact 140 to 150 (i.e., into the page in FIG. 1B or 1C). A base voltage $V_b$ of the positive polarity could alternatively be used. Base current $J_b$ through magnetic nanowire 110 creates in semiconductor layer 120 a magnetic field H that is tangential to concentric circles centered on nanowire 110, and magnetic field H is clockwise in FIGS. 1B and 1C for the specific example of a current flowing from contact 140 to contact 150. Static magnetic fields created by magnetic regions 110 and 130 are effectively zero everywhere with the exception of ends of semiconductor layer 120. This edge effect is negligible in semiconductor layer 120 since semiconductor layer 120 may a length about or larger than 1 μm, which is much more than its typical thickness of 10 to 100 nm.

For electron injection, an emitter voltage $V_e$ is applied between electrical contacts 160 and 140. As a result, a current may flow through semiconductor layer 120 between magnetic nanowire 110 and magnetic layer 130. As a specific example, the following description assumes that emitter voltage $V_e$ has a positive polarity so that the direction of electrons flow is from magnetic nanowire 110 to magnetic layer 130. Alternatively, device 100 could use an emitter voltage $V_e$ with a negative polarity, which would cause an electron flow in the opposite direction.

FIGS. 1B and 1C show the directions of the drift velocity v and spin σ of electrons entering semiconductor layer 120 from magnetic nanowire 110 when emitter voltage $V_e$ is positive. The amount of current that actually flows between magnetic nanowire 110 and magnetic layer 130 depends on whether magnetic field H inside semiconductor layer 120 rotates of spin σ toward or away from the predominant direction of conduction electrons in magnetic layer 130.

When magnetic nanowire 110 injects spin-polarized electrons into magnetic layer 130 through semiconductor layer 120, a transit time $\tau_T$ of the electrons traversing semiconductor layer 120 should not exceed the spin-relaxation time $\tau_S$, i.e., the time of spin coherence of electrons in semiconductor layer 120. In other words, spin ballistic transport is desired. Theoretical calculations and experimental studies indicate that the longest values for spin-relaxation time $\tau_S$ can be realized in negatively-doped (i.e., n-type) semiconductors and can reach up to 1 ns in materials such as n-ZnSe and n-GaAs at room temperature.

Transit time $\tau_T$ is equal to the ratio of the thickness d of semiconductor layer 120 and the drift velocity v of the electrons traversing semiconductor layer 120. The drift velocity v in turn depends on the applied electric field E, the electron mobility $\mu_n$, and the diffusion constant $D_n$ in semiconductor layer 120 as indicated in Equation (1). From Equation (1), the condition that transit time $\tau_T$ be less than spin-relaxation time $\tau_S$ limits the maximum thickness $d_{max}$ of semiconductor layer 120 for spin ballistic transport as indicated in Equation (2). The maximum thickness $d_{max}$ for a typical semiconductor with suitable characteristics is generally about or less than 1 μm.

$$v = \mu_n \overline{E} + D_n/d \quad (1)$$

$$\tau_T \leq \tau_S, \text{ or } d < d_{max} = \sqrt{D_n \tau_S} + \tau_S \mu_n E \quad (2)$$

Transit time $\tau_T$ and the corresponding angular frequency $\omega_0$ or $2\pi/\tau_T$ are also limits on the operating speed or frequency of device 100. However, with transit time $\tau_T$ less than a 1-ns spin-relaxation time $\tau_S$, device 100 can operate at a frequency of 1 GHz or more.

The conductivity G between concentric magnetic layers 110 and 130, i.e., between electrical contacts 140 and 160 generally depends on an angle θ between spin directions of electrons in semiconductor layer 120 near the magnetic layer 130 and the magnetization in the magnetic layer 130. The receiving interface effectively acts as a spin filter with a resistance depending on spin orientation of the spin-polarized electrons in the control region 120, near the receiving interface.

Equation (3) indicates the conductivity G between magnetic layers 110 and 130 when semiconductor layer 120 is sufficiently thin that the spin polarization states of the electrons traversing layer semiconductor 120 remain coherent. In particular, Equation (3) is valid when semiconductor layer 120 is relatively thick and the spin ballistic transport is realized, i.e., the condition of Equation (2) is fulfilled. In Equation (3), parameters $P_1$ and $P_2$ represent the degrees of spin polarizations of currents crossing the first and second magnetic-semiconductor (M-S) interfaces. Thus, parameter $P_1$ represents the spin polarization of electrons entering semiconductor layer 120 from magnetic nanowire 110, and parameter $P_2$ represents the spin polarization of the spin-polarized electrons entering semiconductor layer 120 from magnetic layer 130. Angle θ is the angle between the spin σ of injected spin-polarized electrons in semiconductor layer 120 near the magnetic layer 130 and the magnetization $M_2$ in the magnetic layer 130.

$$G = G_0(1 + P_1 P_2 \cos \theta) = G_0[1 + P_1 P_2 \cos(\theta_0 + \theta_H)] \quad (3)$$

Magnetization $M_1$ in magnetic nanowire 110 determines the direction of spin-polarized conduction electrons injected into semiconductor layer 120 from the magnetic nanowire 110. Absent spin rotation in semiconductor layer 120, angle θ is equal to the angle $\theta_0$ between magnetizations $M_1$ and $M_2$, which is 180° for the magnetization directions illustrated in FIG. 1B and 90° for the magnetization directions illustrated in FIG. 1C. The illustrated embodiment of FIG. 1B thus provides a minimum conductivity $G_0(1-P_1 P_2)$ if the electrons retain their spin when crossing semiconductor layer 120. However, magnetic field H can be used to change the spin directions and therefore change the conductivity G between contacts 140 and 150. When accounting for a rotation of the spins of electrons traversing semiconductor layer 120, angle θ is equal to the sum $\theta_0+\theta_H$ where angle $\theta_0$ is the angle between the magnetizations $M_1$ and $M_2$ of magnetic materials 110 and 130 and angle $\theta_H$ is the amount of spin rotation in semiconductor layer 120.

Rotation angle $\theta_H$ depends on magnetic field H in semiconductor layer 120. In particular, base voltage $V_b$ drives base current $J_b$ that flows along magnetic nanowire 110 and induces a radially symmetrical magnetic field H around magnetic nanowire 110. Equation (4) indicates the magnitude of magnetic field H in terms of base current $J_b$ and a radial distance ρ from the center of nanowire 110. When base current $J_b$ is greater than 25 mA and radius ρ in semiconductor layer 120 is less than about 40 nm, the magnitude of magnetic field H will be greater than about 1000 Oe. A very thin wire, i.e., a nanowire 110 having a radius less than about 40 nm can thus provide a strong enough magnetic field.

$$H=J_b/2\pi\rho \quad (4)$$

The spins σ of the injected spin-polarized electrons precess in magnetic field H during transit through semiconductor layer 120. The spin rotation of an electron in a magnetic field H is well known to have an angular frequency $\gamma H_n$ where the electron gyromagnetic ratio in vacuum γ is about $1.76 \times 10^7 \text{Oe}^{-1}\text{s}^{-1}$ or $2.2 \times 10^5 \text{(m/A)s}^{-1}$ and field component $H_n$ is the magnetic field component normal to the spin. In device 100, magnetic field H remains perpendicular to the spin direction, and component $H_n$ is equal to the magnitude of magnetic field H. The rotation angle $\theta_H$ for the spin of an electron crossing semiconductor layer 120 is thus approximately given in Equations (5), where a variable $k_j$ is a gain factor, which is introduced to simplify Equation (5). The factor g below is the gyromagnetic factor, which is close to 2 in vacuum but may have a different value in the solid state matrix of semiconductor layer 120.

$$\theta_H = \frac{g}{2}\gamma\tau_t H = \frac{g}{2}\gamma\tau_t J_b(t)/2\pi\rho \equiv k_J J_b(t),$$
$$k_J \equiv g\gamma\tau_t/4\pi\rho \quad (5)$$

The conductivity of device 100 as indicated in Equation (3) above thus depends on the base current $J_b$ and on the directions of magnetizations $M_1$ and $M_2$. Base current $J_b$ can be static or time-dependent, e.g., of the form $J_{b0}\cos(\omega t)$ for an angular frequency ω that is less than $2\pi/\tau_t$. Magnetizations $M_1$ and $M_2$ of magnetic wire 110 and magnetic layer 130, respectively, have directions that can be selected to achieve desired device characteristics. In particular, different relative orientations of magnetizations $M_1$ and $M_2$ provide devices capable of acting as a current amplifier, a square law detector, a frequency multiplier, or a pulse transistor.

Device 100 of FIG. 1A can operate as a current amplifier when the magnetization $M_1$ of magnetic nanowire 110 is substantially perpendicular to the magnetization $M_2$ of magnetic layer 130. As a rule, the magnetization $M_1$ of a thin ferromagnetic wire 110 is directed along an axis of the wire. Magnetization $M_2$ can be made tangential to the surface of magnetic layer 130, as illustrated in FIG. 1C, when magnetic layer 130 has a thickness d less than a domain wall thickness $L_0$ of the magnetic material but greater than about 3–5 mm. Alternatively, magnetization $M_2$ of magnetic layer 130 can be made perpendicular to the surface of the ferromagnetic film when magnetic layer 130 has a thickness d that is equal to or less than about 4–5 nm. In either case, angle $\theta_0$ between magnetizations $M_1$ and $M_2$ is equal to π/2 (i.e., a right angle), and Equation (3) simplifies to the form of Equation (6).

$$G=G_0(1+P_1P_2\sin\theta_H) \quad (6)$$

When a constant emitter voltage $V_e$ is applied, the "emitter" current $J_e$ through device 100 is equal to the product of emitter voltage $V_e$ and the conductivity G. For a small rotation angle $\theta_H$, Equation (7) indicates that the variable component emitter current $J_e$ is proportional to rotation angles $\theta_H$ and therefore to base current $J_b$. In Equation (7), the current $J_{e0}$ is equal to the product of conductivity constant $G_0$ and emitter voltage $V_e$, parameters $P_1$ and $P_2$ are the degrees of spin polarization at the semiconductor-magnetic interfaces, $k_j$ is the variable introduced for Equation (5) evaluated at a radial distance $\rho_s$ that is a typical radius of semiconductor layer 120 (i.e., $k_J=g\gamma\tau_t/4\pi\rho_s$). The current gain $K_J$ of the amplifier is indicated in Equation (8).

$$J_e=GV_e \approx J_{e0}(1+P_1P_2\theta_H)=J_{e0}(1+P_1P_2k_JJ_b) \quad (7)$$

$$K_J=\partial J_e/\partial J_b=J_{e0}P_1P_2k_J \quad (8)$$

Equation (7) and particularly the dependence of gain factor $k_J$ on radial distance ρ indicates that a very thin wire 110, i.e., with the radius $\rho_0$ less than 100 nm can provide a larger current gain. Indeed, gain factor $k_J$ is equal to $10^3$ $A^{-1}$ when semiconductor radius $\rho_s$ is equal to about 30 nm and transit time $\tau_T$ greater than $10^{-10}$ s, and current gain $K_J$ can amount to very large value for ultrahigh angular frequency $2\pi/\tau_t$ greater than 100 GHz even when the product of spin factors $P_1P_2$ is less than 0.1.

Device 100 can implement an ultrafast square law detector or frequency multiplier when the magnetization $M_1$ inside magnetic nanowire 110 is substantially parallel or anti-parallel to the magnetization $M_2$ inside magnetic layer 130. Parallel or antiparallel magnetizations can be realized when magnetic nanowire 110 is relatively thin (less than about 4–5 nm) and the thickness d of magnetic layer 130 is greater than 5 nm but less that the typical width L of a magnetic domain wall in magnetic layer 130. In these cases, angle $\theta_0$ is 0 or π for the parallel or antiparallel magnetizations, and a combination of Equations (3) and (5) indicates that for small angles $\theta_H$ and a constant emitter voltage $V_e$, the emitter current $J_e$ depends on the base current $J_b$ as indicated in Equation (9).

$$J_e=J_{e0}(1\pm P_1P_2\cos\theta_H)\approx J_{e0}(1\pm P_1P_2)\mp J_{e0}P_1P_2k_J^2J_b^2(t) \quad (9)$$

The case when magnetizations $M_1$ and $M_2$ are antiparallel, as illustrated in FIG. 1B, is preferable because the constant term $J_{e0}(1-P_1P_2)$ for the antiparallel magnetizations is less than the constant term $J_{e0}(1+P_1P_2)$ for the parallel magnetizations. Equation (9) shows that the time-dependent component $J_{e0}P_1P_2k_J^2J_b^2(t)$ of emitter current $J_e$ is proportional to the square of base current $J_b$. A square-law detector thus generates the emitter current $J_e$ as a signal with changes that are proportional to the square of an input signal $J_b$.

When base current $J_b(t)$ has a sinusoidal time dependence, e.g., base current $J_b(t)$ is proportional to cos(ωt), the emitter current $J_e$ has a time-dependent component that varies as the square of the sinusoid, e.g., a component proportional to $\cos^2(\omega t)=\frac{1}{2}[1+\cos(2\omega t)]$ and therefore includes a component that varies at twice the frequency of base current $J_b$. The device thus provides a doubling of frequency, which can be realized up to ultrahigh frequencies, e.g., 500 GHz. Squared variable $k_J^2$ is about equal to $10^6$ $A^{-2}$ when semiconductor radius $\rho_s$ is less than about 30 nm and transit time $\tau_T$ is greater than or equal to $10^{-10}$ s.

When base current $J_b$ is a superposition of components having two different frequencies $\omega_1$ and $\omega_2$, e.g., $J_b(t) \propto \cos(\omega_1 t) + \cos(\omega_2 t)$, the emitter current $J_e$ for fixed emitter voltage $V_e$ includes components that vary at twice the individual frequencies $2\omega_1$ and $2\omega_2$, at the sum $\omega_1 + \omega_2$ of the individual frequencies, and at the difference $\omega_1 - \omega_2$ of the individual frequencies. The component having the desired frequency can be extracted using a resonance amplifier for the desired frequency. The emitter current is then able to work as a heterodyne oscillator to generate and amplify a signal having doubled frequency $2\omega_1$ or $2\omega_2$, the sum frequency $\omega_1 + \omega_2$, or the difference frequency $\omega_1 - \omega_2$.

A high-speed transistor can be realized when the magnetization $M_1$ of magnetic nanowire 110 is antiparallel to the magnetization $M_2$ of magnetic layer 130. In this case, angle $\theta_0$ is equal to $\pi$, and Equation (10) indicates the emitter current $J_e$ for a constant applied emitter voltage $V_e$.

$$J_e = GV_e = G_0 V_e (1 - P_1 P_2 \cos \theta_H) = G_0 V_e (1 - P_1 P_2 \cos(k_J J_b)) \quad (10)$$

Emitter current $J_e$ of Equation (10) reaches a maximum emitter current $J_{emax}$ when $\theta_H = k_J J_b$ is equal to $\pi$. Variable $k_J$, as noted above, has a value of about $10^3$ A$^{-1}$ when radius $\rho_s$ is equal to about 30 nm and $\tau_t$ is equal to or greater than $10^{-10}$ s, so that rotation angle $\theta_H$ will be equal to $\pi$ for a base current $J_b$ close to 1 mA. In other words, when base current $J_b$ pulses with an amplitude of about 1 mA for a duration greater than transit time $\tau_t$, the variable component of emitter current $J_e$ increases by a factor $K_m$, which is given in Equation (11). If the spin polarization fractions $P_1$ and $P_2$ are close to unity, the variation of the emitter current $J_e$ can reach several orders of magnitude.

$$J_{emax}/J_{emin} = (1 + P_1 P_2)/(1 - P_1 P_2) = K_m \quad (11)$$

Another transistor configuration has the magnetization $M_1$ in magnetic nanowire 110 perpendicular to the magnetization $M_2$ in magnetic layer 130. From Equations (6) and (7), the time-dependent component of emitter current $J_e$ for a constant emitter voltage $V_e$ can be shown to have the form of Equation (12) when emitter current $J_e$ is relatively small. Since gain factor $k_J$ is about $10^3$ A$^{-1}$ when radius $\rho_s$ is equal to about 30 nm and $\tau_T$ is equal to or greater than $10^{-10}$ s, the amplitude of time dependent component $J_e(t)$ of the emitter current can thus exceed the amplitude of base current $J_b(t)$ by several orders of amplitude even when the product $P_1 P_2$ of the spin polarization fractions is much less than 1. In other words, the spin-injection transistor may be a sensitive device even for a short pulse duration greater than transit time $\tau_t$. For a relatively small base current $J_B \ll k_J$, emitter current $J_e$ is approximately given by Equation (12).

$$J_e(t) \approx J_{e0} P_1 P_2 \theta_H = P_1 P_2 k_J J_{e0} J_b(t) \quad (12)$$

Figure 2A:
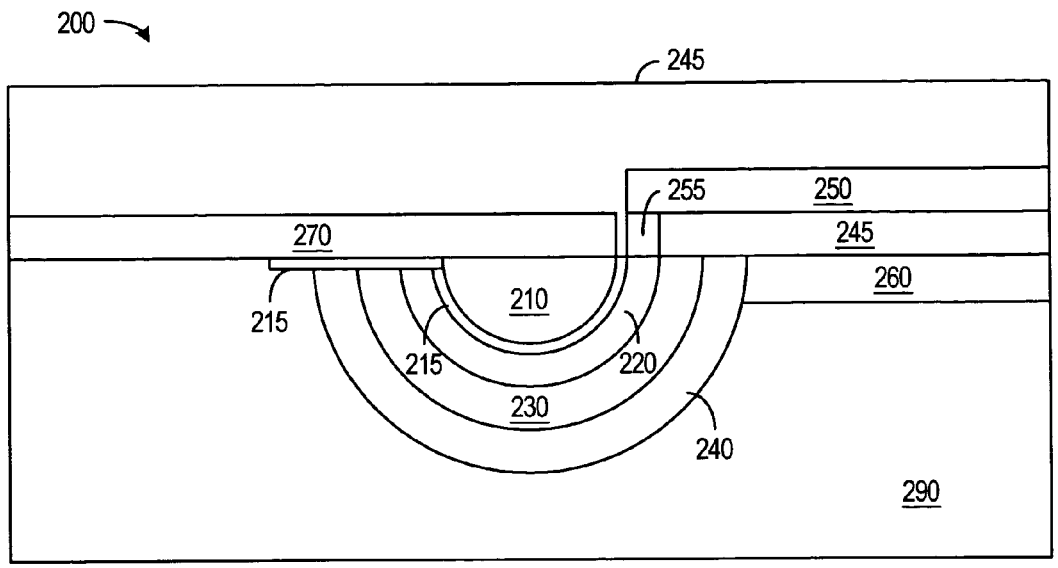
FIGS. 2A and 2B respectively show a cross-section and a perspective view of a spin injection device according to an embodiment of the invention including magnetic and semiconductor semi-cylindrical regions formed in a trench.
Figure 2B:
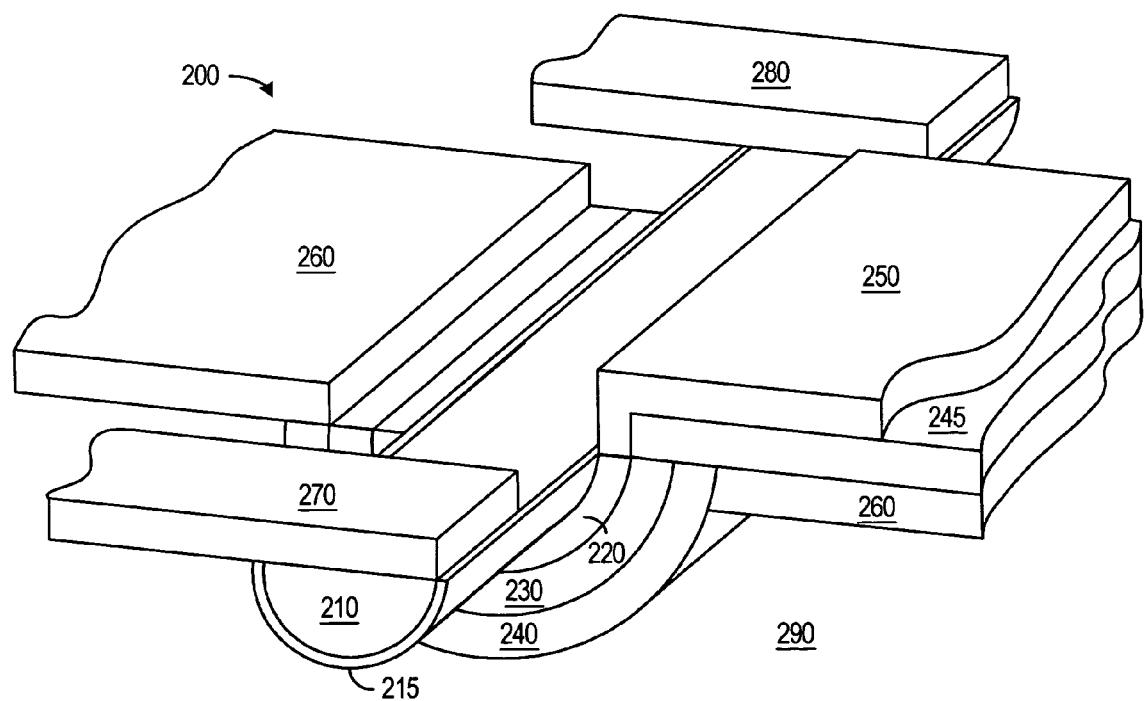

Device 100 of FIGS. 1A, 1B, and 1C is useful for illustration of some of the principles of the invention but is difficult to construct. Alternative embodiments of the invention can be constructed using a combination of fabrication processes that are known for creating magnetic layers and semiconductor devices. FIGS. 2A and 2B, for example, are an end view and a cutaway perspective view of spin injection device 200 in accordance with an embodiment of the invention that is more easily manufactured. Device 200 of FIGS. 2A and 2B uses magnetic and semiconductor layers that can be operated in the manner described above for device 100 of FIGS. 1A, 1B and 1C to implement devices such as current amplifiers, square law detectors, frequency multipliers, and pulse transistors.

FIGS. 2A and 2B respectively illustrate an end view and a perspective view of device 200. As illustrated, device 200 includes a nanowire 210, a dielectric layer 215, a first magnetic layer (emitter) 220, a semiconductor (control) layer 230, and a second magnetic layer (collector) 240 that are formed in and on a substrate 290. The device 200 further includes electrodes 250 and 260 that respectively contact magnetic layers 220 and 240, and electrodes 270 and 280 that contact opposite ends of nanowire 210.

Nanowire 210 is preferably a metal wire having a semicircular cross-section and a radius $\rho_0$ less than about 100 nm. The thickness of the other layers 215, 220, 230 and 240 are less than radius $\rho_0$, with the thickness w of dielectric layer 215 preferably being less than 10 or 20 nm and more than 1 or 2 nm (the latter being needed in to reduce a leakage current). Device 200 differs from device 100 in that dielectric layer 215 isolates the current carrying nanowire 210 from the first magnetic layer 220, so that a magnetic material is not required to conduct the base current $J_b$ that generates the magnetic field H in semiconductor layer 230. Nanowire 210 can thus be made of a highly conductive metal such as Al, Au, Pt, Ag, or Cu or polysilicon or a highly doped semiconductor such as Si, GaAs, InSb, InAs, InGa, or InP. A voltage drop in base circuit $J_b$ between electrodes 270 and 280 can thus be less in device 200 than in device 100 of FIGS. 1A and 1B. Additionally, the bias voltage $V_b$ driving the base current $J_b$ is separate from and has less effect on the emitter circuit, i.e., between electrodes 250 and 260.

A fabrication process for device 200 begins with substrate 290, which can be a semiconductor, including Si, or dielectric substrate, in which a trench has been etched or otherwise formed. The trench is preferably semicircular with a radius equal to the outer radius of magnetic layer 240, e.g., about 30 nm to 150 nm. Alternatively, a trench having a rectangular or other shape could be employed.

Magnetic material is then deposited on substrate 290 and particularly in the trench in a manner that provides the desired magnetization direction $M_2$ for magnetic layer 240. One deposition method for magnetic layer 240 deposits a thin conformal layer having a thickness between about 3 nm and 30 nm on substrate 290. Alternatively, a thicker magnetic layer can be deposited and etched back to the desired dimensions of magnetic layer 240. An anti-ferromagnetic pinning layer made of a material such as FeMn, IrMn, NiO, MnPt (Ll$_0$), or $\alpha$-Fe$_2$O$_3$ can be provided under magnetic layer 240 to pin the direction of magnetization $M_2$.

Semiconductor layer 230, which can be a material such as Si, Ge, ZnSe or GaAs having a relatively long spin coherence time $\tau_s$, is then deposited over magnetic layer 240. Again, semiconductor layer 230 can either be deposited conformally to the desired thickness, e.g., about 20 to 100 nm, or etched after deposition of a thicker layer to leave semiconductor layer 230 and the remaining trench with their desired sizes. Semiconductor layer 230 is preferably an n-type material and can either include an in-situ n-type doping when deposited or can be doped with appropriate impurities after deposition.

Magnetic layer 220 is formed on semiconductor layer 230 using the same techniques as used to form magnetic layer 240 with the exception that the magnetization $M_1$ of magnetic layer 220 may differ from the magnetization $M_2$ of magnetic layer 240.

Dielectric layer 215 can then be deposited or grown on magnetic layer 220. Dielectric layer 215 can be a material such as SiO$_2$, Al$_2$O$_3$, or other metal oxide and preferably has a thickness between about 2 nm and 5 nm. After formation of dielectric layer 215, a deposition of a high conductivity metal fills the remaining portion of the trench and forms nanowire 210.

After formation of magnetic layer 240, semiconductor layer 230, magnetic layer 220, insulating layer 215, and nanowire 210, the top surface of substrate 290 can be planarized or etched to remove the deposited materials from the portion of the surface of substrate 290 that is outside the trench. Electrodes 250, 260, 270, and 280 can then be formed to contact respective layers 220, 240, and 210 using conventional techniques. Electrode 260 contacting magnetic layer 240 can alternatively be formed in substrate 290 before formation of the trench.

In the illustrated embodiment, electrode 260 contacts the outer magnetic layer 240 and can be formed by patterning a metal layer deposited directly on substrate 290. Electrode 250, which contacts inner magnetic layer 220, is formed on an insulating layer 245 including an opening containing a conductive plug 255. Conductive plug 255 can optionally be made of the same ferromagnetic material and with the same magnetization $M_1$ as magnetic layer 220 to minimize injection of electrons that are not spin-polarized where plug 255 is near or overlapping semiconductor layer 220. Electrodes 250 and 260 can contact respective magnetic regions 220 and 240 along their entire length of magnetic regions 240 and 250, so that the conductivity of the emitter circuit in device 200 is high.

FIG. 2B also illustrates that end contacts 270 and 280 to nanowire 210 can be formed away from layers 220, 230, and 240 by extending nanowire 210 further than the lengths of layers 220, 230, and 240. This can be achieved by limiting the lateral extent of layers 220, 230, and 240 or by extending the length of the trench after formation of magnetic layer 220, so that deposited nanowire 210 extends beyond layers 220, 230, and 240.

Figure 3A:
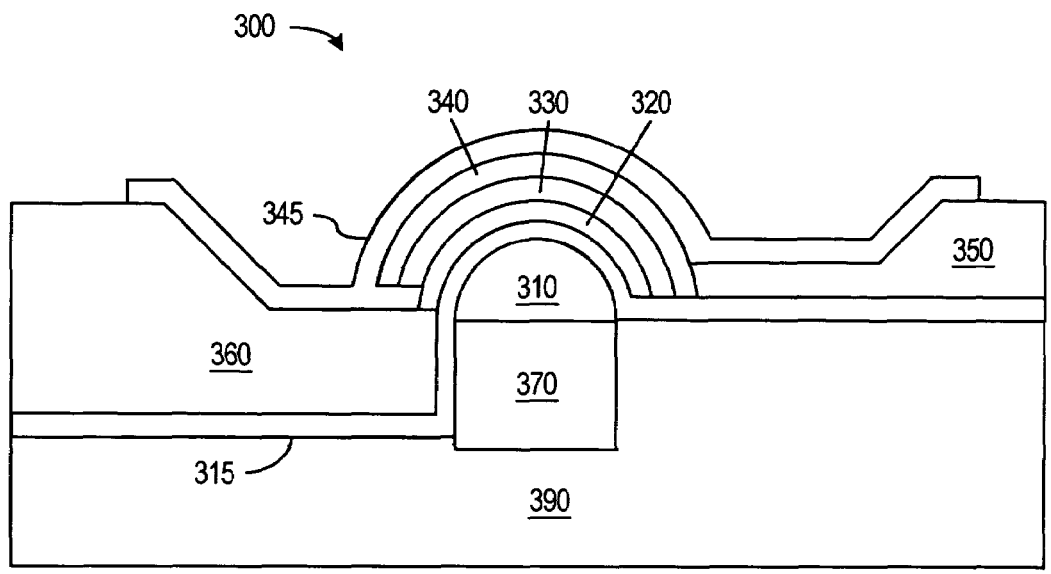
FIGS. 3A and 3B respectively illustrate a cross-section and a cutaway view of a spin injection device according to an embodiment of the invention including a semiconductor nanowire overlying a control region that is sandwiched between magnetic regions.
Figure 3B:
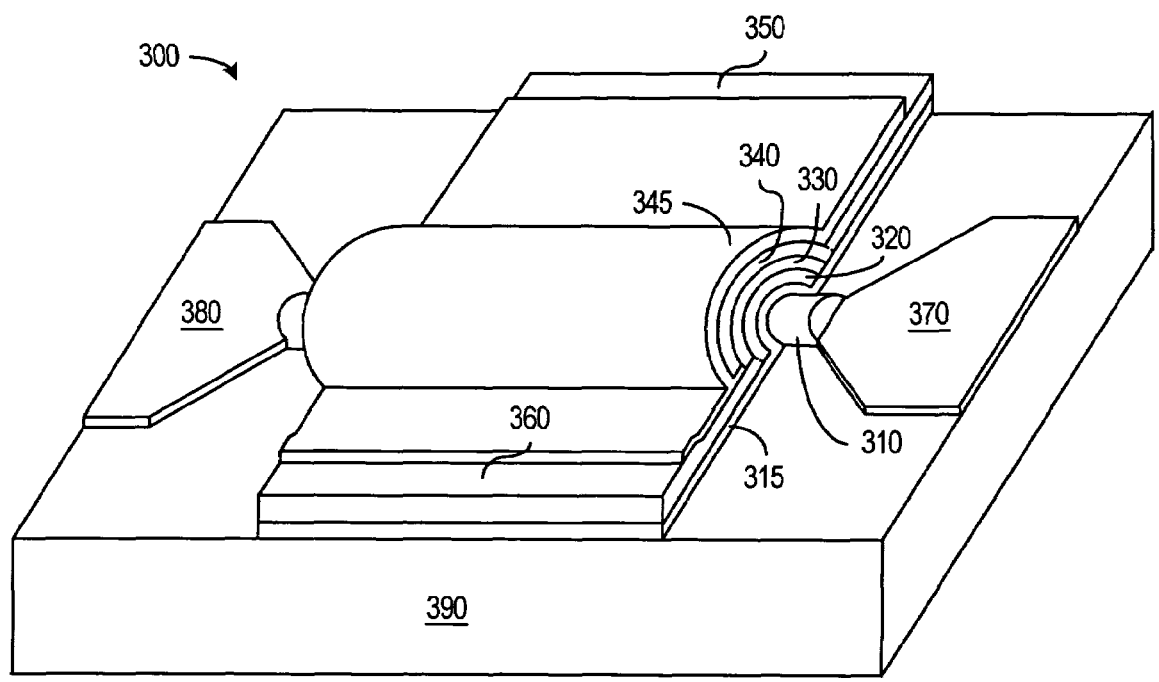

FIGS. 3A and 3B show a spin injection device 300 in accordance with an embodiment of the invention that can be fabricated without forming layers in a trench. Device 300 includes a conductive nanowire 310 that is nearly semicircular and covered by a thin dielectric layer 315, a first magnetic layer 320, a semiconductor layer 330, and a second magnetic layer 340. Electrodes 350 and 360 contact magnetic layers 320 and 340, and electrodes 370 and 380 contact the face planes (or ends) of nanowire 310.

Nanowire 310 has radius $\rho_0$ of that obviously less than the radius $\rho_s$ of semiconductor layer 330, which is preferably less than 100 nm. The length of nanowire 310 can be on the order of about 1 μm but is more generally limited by acceptable maximum resistance of nanowire 310.

The thickness dielectric layer 315 between nanowire 310 and magnetic layer 320 is preferably greater than 1 to 2 nm to isolate nanowire 310 from magnetic layer 320 but is preferably less than 10 to 20 nm. Since dielectric layer 315 isolates nanowire 310 from magnetic layer 320, the electrical circuits for base current $J_b$ and emitter current $J_e$ are independent. The conductivity G of the emitter circuit in device 300 is much higher than the conductivity of the base circuit merely from geometry (i.e., the areas) of layers 320, 330, and 340 in device 300.

Magnetic layers 320 and 340 have fixed magnetizations $M_1$ and $M_2$ that are selected according to the desired properties of device 300. The thickness $d_1$ of magnetic layer 320 should be less than radius $\rho_S$ and is preferably less than a typical width $L_0$ of magnetic domain walls in the magnetic material. Usually, domain wall width $L_0$ is about 10–50 nm. When magnetic layer 320 has a thickness $d_1$ less than the width $L_0$ of magnetic domain walls but greater than 3 to 5 nm, the magnetization $M_1$ of thin magnetic film 320 lies in the film plane and can be directed along the axis of nanowire 310.

The thickness d of semiconductor layer 330 between magnetic layers 320 and 340 is preferably greater than 10 nm but less than 100 nm.

In a fabrication process for device 300, a substrate 390 is prepared to contain underlying conductive contacts such as part of electrodes 360, 370, and 380. The underlying contacts can be made of a conductive material such as a metal or a highly doped region of semiconductor material. Regions of insulating dielectric 315 can be provided in substrate 390 where required to isolate the conductive structures.

A layer of highly conductive material is then deposited on substrate 390 with a pattern that forms nanowire 310 in an area isolated from the contacts in substrate 390. The patterned material can be made by press forming and can be heated or otherwise liquefied so that beading provides the desired semicircular cross-section to nanowire 310. U.S. Pat. No. 6,432,740, which is incorporated by reference in its entirety, describes a suitable method for forming a nanowire of the appropriate size, but other methods could alternatively be used.

Additional portions of thin dielectric layer 315 are then grown and/or deposited on nanowire 310. Magnetic layer 320 is deposited to overlie dielectric layer 315 and nanowire 310 and to extend laterally far enough to make good contact with underlying terminal 360.

A portion of an insulating layer 345 is formed on terminal 360 before semiconductor layer 330 is deposited on magnetic layer 320, and a magnetic layer 340 is formed on semiconductor layer 330. Insulating layer 345 electrically insulates magnetic layer 320 and semiconductor layer 330 from terminal 360. A metal layer or other conductive layer forming terminal 350 is deposited in electrical contact with magnetic layer 340. The remainder of insulating dielectric layer 345 can then be deposited to provide insulation with openings for electrical connections to terminals 350, 360, 370, and 380.

Figure 4A:
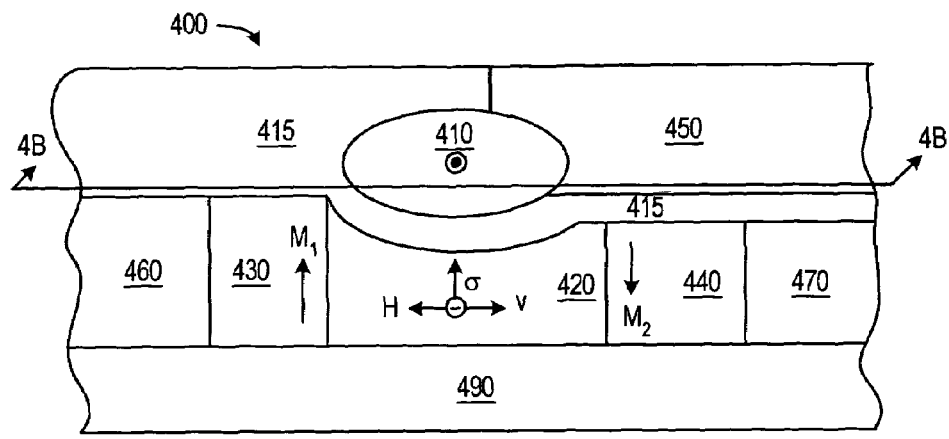
FIGS. 4A and 4B respectively show a cross-section and a cutaway view of a device in which a nanowire overlies a semiconductor region.
Figure 4B:
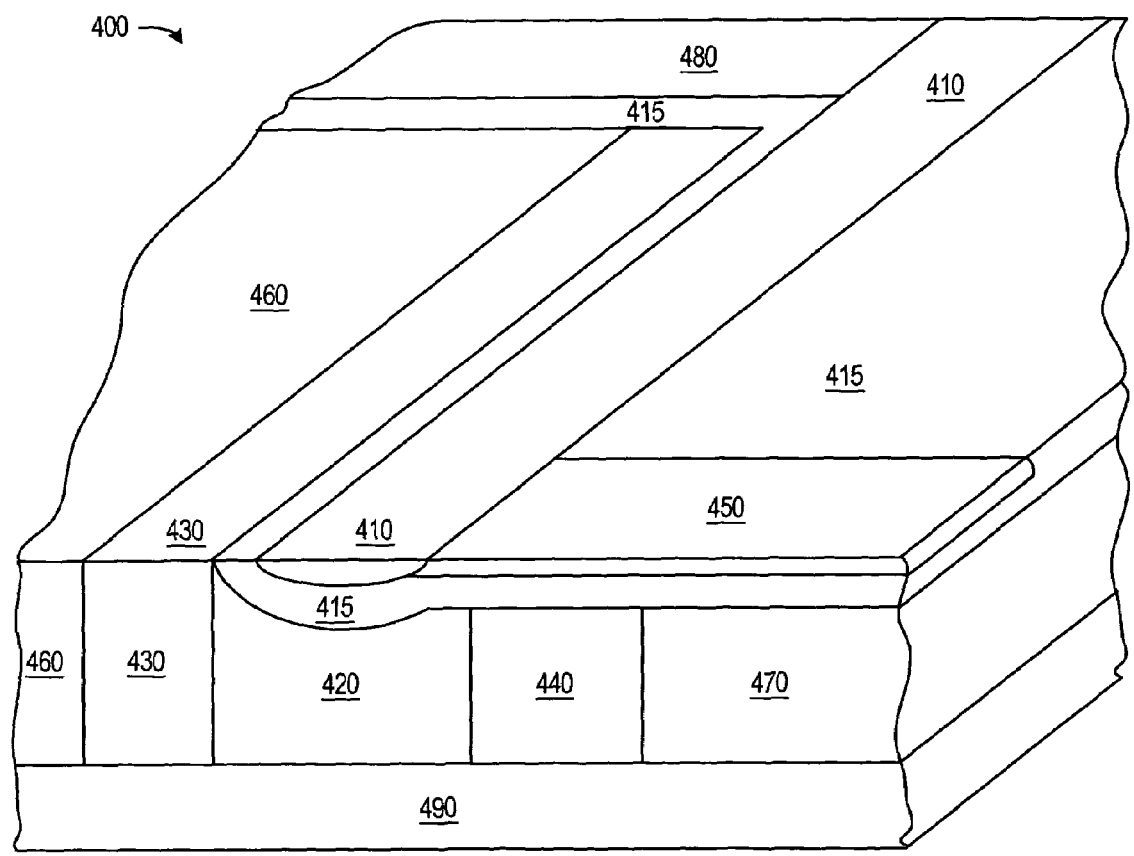

FIGS. 4A and 4B illustrate a device 400 in which a nanowire 410 overlies a semiconductor region. FIG. 4A shows a cross-section of device 400, and FIG. 4B shows a cutaway view of device 400 after removal of a top portion designated by the section line 4B in FIG. 4A.

As illustrated, device 400 includes nanowire 410, a dielectric layer 415, semiconductor region 420, a first magnetic region 430, and a second magnetic region 440. Magnetic regions 430 and 440 and semiconductor region 420, which is between magnetic regions 430 and 440, are on a surface of a substrate 490. Electrodes 460 and 470, which respectively contact magnetic regions 430 and 440, extend along the surface of substrate 490 to external contacts (not shown) or to other devices (not shown) that may be formed on substrate 490. Regions 420, 430, and 440 and electrodes 460 and 470 can be formed in a series of deposition and patterning processes using photolithographic patterning techniques. Alternatively, the patterned materials can be made by press forming such as described in U.S. Pat. No. 6,432,740, which is incorporated by reference in its entirety. The resulting structure can be made substantially planar with the exception of an optional indentation or trench in semiconductor region 420 that may be formed to accommodate nanowire 410.

A layer of an insulating material such as $SiO_2$, $Al_2O_3$ or other metal oxides about 2 to 4 nm thick is deposited on regions 420, 430, and 440 and electrodes 460 and 470 to form a first portion of dielectric layer 415. Nanowire 410, which can be made of a high conductivity metal, is then formed, for example, by metal deposition and patterning. Optionally, electrodes 450 and 480 contacting opposite ends of nanowire 410 can be formed at this time from the same material as nanowire 410. After formation of nanowire 410, a second portion of dielectric layer 415 is deposited to encircle and insulate nanowire 410. If electrodes 450 and 480 were not previously formed, electrodes 450 and 480 can be formed on dielectric layer 415 and contact the ends of nanowire 410 through openings in dielectric layer 415.

Semiconductor region 420 should have a thickness less than about 100 nm to maintain the coherence of the spin states of electrons traversing semiconductor region 420. The typical thickness or diameter of nanowire 410 should also be less than about 100 nm to provide a strong magnetic field H in semiconductor region 420. The thickness of magnetic layers 430 and 440 is approximately the same as the thickness of semiconductor layer 420 in FIG. 4A but may differ in other device configurations.

Dielectric layer 415 should have a thickness between metal nanowire 410 and semiconductor layer 420 that is less than the radius $\rho_0$ of nanowire 410 to provide a strong magnetic field but thicker than about 2 nm to provide adequate insulation. The dielectric layer 415 isolates nanowire 410 from semiconductor layer 420 and magnetic layers 430 and 440.

Nanowire 410, being separated from the emitter circuit by dielectric layer 415, can be made from a high conductive metal such as Al, Au, Pt, Ag, or Cu or polysilicon or highly doped semiconductor such as Si, GaAs, InSb, InAs, InGa, or InP. As a result, the drop in base voltage $V_b$ between electrodes 450 and 480 is less than the base voltage drop for device 100 of FIG. 1A, and base voltage $V_b$ does not affect the voltage drop in the emitter circuit, i.e., between electrodes 460 and 470. Moreover, the conductivity of the emitter circuit is much higher merely from the geometry of device 400. In particular, nanowire 410 may have a diameter that is a few tens of nanometers, while magnetic regions 430 and 440 have thicknesses of a few tens of nanometers but lengths typically on the order of 1 μm or larger.

Figure 5:
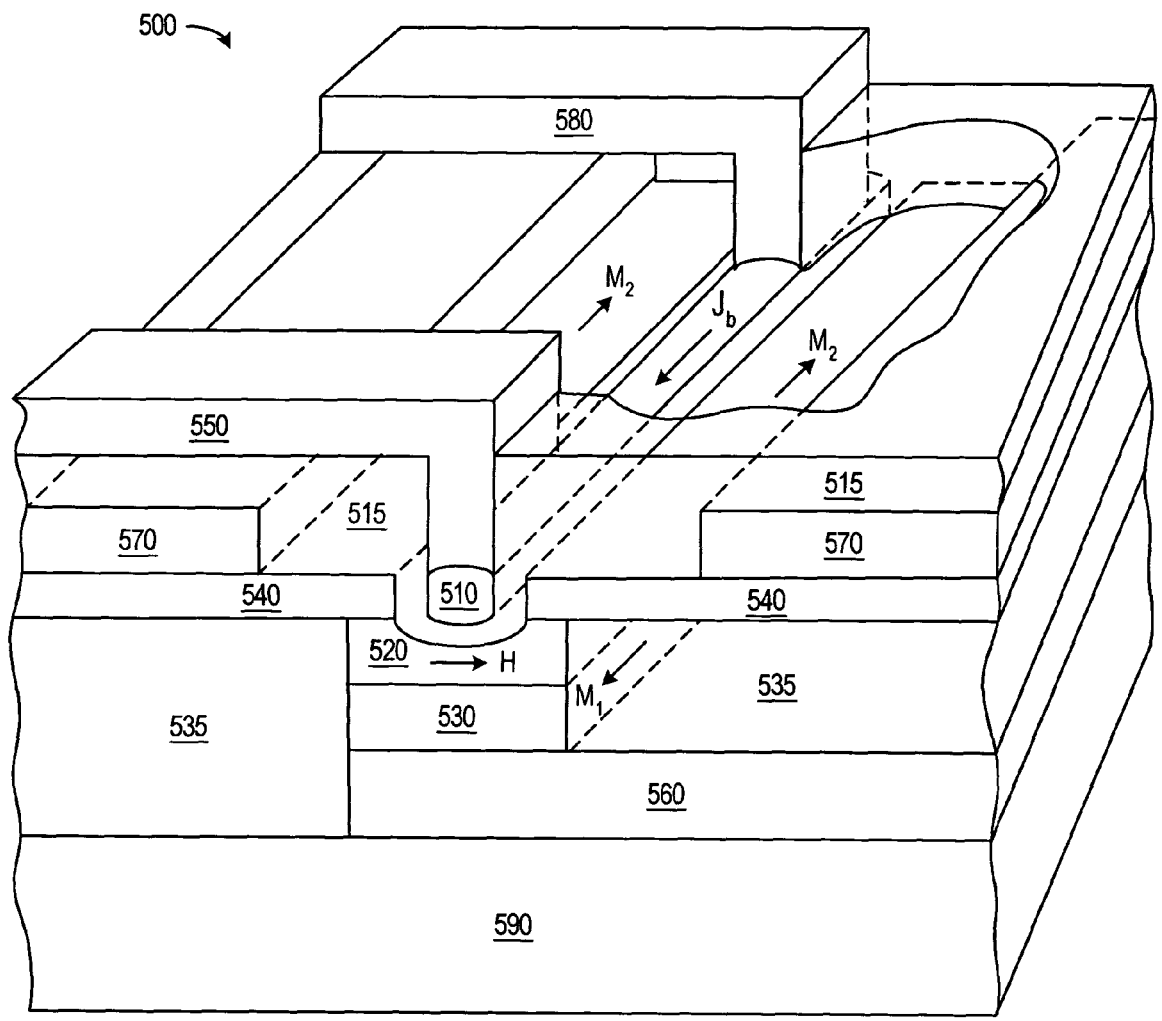
FIG. 5 illustrates a spin injection device according to an embodiment of the invention including vertically spaced magnetic films.

FIG. 5 shows a spin injection device 500 according to an embodiment of the invention using vertically-spaced magnetic regions 530 and 540. Device 500 includes a semiconductor region 520 on magnetic region 530 and a nanowire 510 that overlies semiconductor region 520. Magnetic regions 540 overlap opposite ends of semiconductor region 520. A dielectric layer 515, which includes a portion that separates nanowire 510 from magnetic regions 540 and semiconductor region 520, is shown as being transparent in FIG. 5 to better illustrate underlying structures.

Device 500 can be fabricated by first forming a conductive interconnect region 560 (e.g., a metal or highly doped semiconductor region) in or on a dielectric or semiconductor substrate 590. Interconnect region 560 provides an electrical connection to magnetic region 530, which is deposited on interconnect region 560. An external contact (not shown) or connection to another device (not shown) on substrate 590 can be laterally separated from device 500. Semiconductor region 520 is deposited on magnetic region 530 and can be patterned using the same mask that controls the dimensions of magnetic region 530. Dielectric regions 535 are then deposited around magnetic region 530 and semiconductor region 520.

Magnetic layer 540 can be deposited on semiconductor region 520 and adjacent dielectric regions 535. Magnetic layers 540, like magnetic layer 530, can be formed of a ferromagnetic material or other material that has spin-polarized conduction electrons. Patterning of magnetic layer 540 exposes a central portion of semiconductor region 520 but leaves magnetic regions 540 in contact with outer portions of semiconductor region 520. Optionally, an etching process through the opening between magnetic regions 540 can create a depression in semiconductor region 520. A thin insulating layer and nanowire 510 are then formed in the opening between magnetic regions 540. The insulating layer becomes part of dielectric layer 515, which separates nanowire 510 from the emitter circuit and therefore permits use of highly conductive metals such as Al, Au, Pt, Ag and Cu or polysilicon or highly doped semiconductor such as Si, GaAs, InSb, InAs, InGa, and InP for nanowire 510.

Contacts to nanowire 510, magnetic region 530, and magnetic regions 540 can then be formed. In particular, metal contact 570 can be formed on magnetic regions 540 and covered with the remainder of dielectric layer 515. Openings can then be formed through dielectric layer 515 for contacts 550 and 580 to the opposite ends of nanowire 510.

The typical sizes of cross-sections of metal nanowire 510 and semiconductor layer 520 should be less than about 100 nm, and the thickness of magnetic layers 530 and 540 may be close to the thickness of semiconductor layer 520. The portion of dielectric layer 515 between metal nanowire 510 and semiconductor layer 520 should be greater than about 2 nm but less than about 100 nm.

Although the invention has been described with reference to particular embodiments, the description is only an example of the invention's application and should not be taken as a limitation. Many additions or variations can be applied in the disclosed amplifiers. For example, anti-ferromagnetic layers made of a material such as FeMn, IrMn, NiO, MnPt ($Ll_0$), or $\alpha$-$Fe_2O_3$ can be added to fix the directions of magnetizations $M_1$ and $M_2$ in the magnetic films.

Additionally, when ferromagnetic metals Ni, Fe, and/or Co are used as magnetic layers in the structures described above, so-called $\delta$-doped layers, which are semiconductor layers that are extremely thin and very heavily doped with n-type dopants, may be formed between semiconductor and magnetic layers, i.e., the $\delta$-doped layers may be located inside the ferromagnetic-semiconductor junction. The specifications of the $\delta$-doped layers are formulated in U.S. patent application Ser. No. 10/284,183, filed Oct. 31, 2002, entitled: "Efficient Spin-Injection Into Semiconductors" and U.S. patent application Ser. No. 10/284,360, filed Oct. 31, 2002, entitled: "Magnetic Sensor Based on Efficient Spin Injection into Semiconductor".

Various other adaptations and combinations of features of the embodiments disclosed are within the scope of the invention as defined by the following claims.

What is claimed is:

1. A device comprising:
   a first magnetic region;
   a second magnetic region;
   a control region that forms a first interface with the first magnetic region and a second interface with the second magnetic region; and
   a wire positioned relative to the control region so that a current through the wire creates in the control region a magnetic field that rotates spins of the electrons traversing the control region.

2. The device of claim 1, wherein the control region is such that an electron spin relaxation time of the control region is longer than a transit time of the electrons traversing control region.

3. The device of claim 1, wherein the control region comprises a semiconductor material.

4. The device of claim 3, wherein the semiconductor material is selected from a group consisting of Si, Ge, GaAs, InAs, GaP, GaInAs, ZnSe, and ZnCdSe.

5. The device of claim 3, wherein the semiconductor material is n-type.

6. The device of claim 1, wherein each of the first and second magnetic regions comprises a ferromagnetic material.

7. The device of claim 1, wherein the first magnetic region has a first magnetization, the second magnetic region has a second magnetization, and the first and second magnetizations are fixed at a relative angle selected to give the device a desired electrical characteristic.

8. The device of claim 1, further comprising terminals that permit biasing of the first and second magnetic regions to cause injection of spin-polarized electrons through the first interface into the control region so that the second interface acts as a spin filter with a resistance depending on spin orientation of the spin-polarized electrons in the control region, near the second interface.

9. The device of claim 1, wherein a bias voltage applied between the first and second magnetic regions causes injection of spin-polarized electrons through the control region between the first magnetic region and the second magnetic region.

10. The device of claim 1, wherein a fixed bias voltage is applied between the first and second magnetic regions, and a first current through the wire changes a second current between the first and second magnetic regions.

11. The device of claim 1, further comprising an insulating material disposed to electrically insulate the wire from the control region, the first magnetic region, and the second magnetic region.

12. A device comprising:
a magnetic wire;
a magnetic region; and
a control region forming a first interface with the magnetic wire and a second interface with the magnetic region, wherein:
the first and second interfaces selectively permit spin-polarized electrons to cross between the magnetic wire and the magnetic region; and
a current along the magnetic wire creates in the control region a magnetic field that rotates spins of the electrons traversing the control region to flow between the magnetic region and the magnetic wire.

13. The device of claim 12, wherein the control region is such that an electron spin relaxation time of the control region is longer than a transit time of the electrons traversing control region.

14. The device of claim 12, wherein the control region comprises a semiconductor material.

15. The device of claim 14, wherein the semiconductor material is selected from a group consisting of Si, Ge, GaAs, InAs, InP, GaInAs, ZnSe, and ZnCdSe.

16. The device of claim 14, wherein the semiconductor material is n-type.

17. The device of claim 12, wherein the magnetic wire comprises a ferromagnetic material.

18. The device of claim 12, wherein the magnetic region comprises a ferromagnetic material.

19. The device of claim 12, wherein the magnetic wire has a first magnetization, the magnetic region has a second magnetization, and the first and second magnetizations are fixed at a relative angle selected to give the device a desired electrical characteristic.

20. The device of claim 12, wherein a bias voltage applied between the magnetic wire and the magnetic region causes injection of spin-polarized electrons through the control region between the magnetic wire and the magnetic region.

21. The device of claim 12, wherein a fixed bias voltage is applied between the magnetic wire and the magnetic region, and a first current through the magnetic wire changes a second current between the magnetic wire and the magnetic region.

22. The device of claim 12, further comprising a first and second contacts connected to opposite ends of the magnetic wire, wherein the current along the wire flows between the first and second contacts.

23. The device of claim 1, further comprising a first and second contacts connected to opposite ends of the wire, wherein the current creating the magnetic field flows between the first and second contacts.

* * * * *

UNITED STATES PATENT AND TRADEMARK OFFICE
CERTIFICATE OF CORRECTION

PATENT NO. : 7,164,181 B2
APPLICATION NO. : 10/631999
DATED : January 16, 2007
INVENTOR(S) : Viatcheslav V. Osipov et al.

It is certified that error appears in the above-identified patent and that said Letters Patent is hereby corrected as shown below:

In column 5, line 63, delete "3–5 mm" and insert -- 3–5 nm --, therefor.

Signed and Sealed this

Thirtieth Day of March, 2010

David J. Kappos
*Director of the United States Patent and Trademark Office*